(12) United States Patent
Iguchi (10) Patent No.: US 9,105,804 B2
(45) Date of Patent: Aug. 11, 2015

(54) METHOD FOR MANUFACTURING LIGHT-RECEIVING DEVICE AND LIGHT-RECEIVING DEVICE

(71) Applicant: Sumitomo Electric Industries, Ltd., Osaka-shi, Osaka (JP)

(72) Inventor: Yasuhiro Iguchi, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/136,204

(22) Filed: Dec. 20, 2013

(65) Prior Publication Data

US 2014/0175585 A1    Jun. 26, 2014

(30) Foreign Application Priority Data

Dec. 25, 2012 (JP) ................................ 2012-281112

(51) Int. Cl.
H01L 27/14 (2006.01)
H01L 31/18 (2006.01)
H01L 31/0304 (2006.01)

(52) U.S. Cl.
CPC .......... H01L 31/184 (2013.01); H01L 31/0304 (2013.01)

(58) Field of Classification Search
CPC . H01L 21/32139; H01L 21/027; H01L 21/20; H01L 21/266; H01L 31/0304; H01L 21/308; H01L 29/7785; H01L 31/072; H01L 31/103; H01L 31/184
USPC ........................................... 257/431; 438/93
See application file for complete search history.

(56) References Cited

U.S. PATENT DOCUMENTS

| | | | |
|---|---|---|---|
| 5,874,752 A * | 2/1999 | Kimura .................... | 257/186 |
| 2009/0127539 A1* | 5/2009 | Shakuda .................... | 257/13 |
| 2012/0168720 A1* | 7/2012 | Akita et al. .................... | 257/21 |

FOREIGN PATENT DOCUMENTS

JP       2006-269978 A     10/2006

OTHER PUBLICATIONS

R.Rehm et al. "*Type-II Superlattices—The Fraunhofer Perspective*", Proceedings of SPIE, vol. 7660, 76601G-1, 2010.

* cited by examiner

*Primary Examiner* — Wael Fahmy
*Assistant Examiner* — Sarah Salerno
(74) *Attorney, Agent, or Firm* — Smith, Gambrell & Russell LLP (57) ABSTRACT

A method for manufacturing a light-receiving device includes the steps of forming a stacked semiconductor layer including a non-doped light-receiving layer, the light-receiving layer having an n-type conductivity; forming a selective growth mask made of an insulating film on the stacked semiconductor layer, the selective growth mask having a pattern including a plurality of openings; selectively growing a selective growth layer doped with a p-type impurity on each portion of the stacked semiconductor layer by using the selective growth mask; and forming a p-n junction in each of plural regions of the light-receiving layer by diffusing the p-type impurity doped in each selective growth layer into the light-receiving layer during growing the selective growth layers. Each of the regions including one of the p-n junctions corresponds to one of the selective growth layers. The p-n junction in one of the regions is formed separately from the p-n junctions in the other regions.

9 Claims, 7 Drawing Sheets

METHOD FOR MANUFACTURING LIGHT-RECEIVING DEVICE AND LIGHT-RECEIVING DEVICE

BACKGROUND OF THE INVENTION

1. Field of the Invention

The present invention relates to a method for manufacturing the light-receiving device and a light-receiving device.

2. Description of the Related Art

Substances such as gases associated with environments or organisms such as animals and plants have the characteristics of absorbing specific infrared light including near-infrared light with a wavelength of about 2 µm to 10 µm. In order to detect the absorption spectra of the substances such as gases associated with environments or organisms such as animals and plants, infrared light-receiving devices are under development. In particular, in the near-infrared to infrared region, the photosensitivity to long-wavelength light is being improved. Here, the infrared light-receiving devices include a light-receiving layer containing a III-V group compound semiconductor. In the light-receiving devices, a planar-type photodiode structure forming a p-n junction by selective diffusion is used to reduce the dark current. In the planar-type photodiode structure, pixel separation is ensured by regions in which impurity (for example, Zn impurity) is not diffused.

Japanese Unexamined Patent Application Publication No. 2006-269978 (hereinafter referred to as Patent Document 1) discloses a mesa-type photodiode structure compared to the planar-type photodiode structure. In a light-receiving device disclosed in Patent Document 1, in order to ensure pixel separation, a groove of a mesa structure extends through a p-n junction in an indium gallium arsenide (InGaAs) light-receiving layer to a high-concentration impurity layer directly on an Indium phosphide (InP) substrate.

R. Rehm, et al., *Type-II Superlatives; The Fraunhofer Perspective*, Proceeding of SPIE, vol. 7660, 76601G-1 discloses a mid-infrared sensor including a light-receiving layer having an indium arsenide (InAs)/gallium antimonids (GaSb) type-II multi quantum well structure (MQS) on a GaSb substrate. This sensor includes a plurality of light-receiving portions (pixels). The pixels are separated by mesa structures. The mesa structures each have junctions (a pin junction and a nip junction) capable of receiving light with two wavelengths due to different quantum well thicknesses. Mesa grooves for element isolation are placed between the mesa structures. The mesa grooves extend through the pin or nip junctions. The mesa structures reliably separate the pixels included in this sensor.

SUMMARY OF THE INVENTION

In the planar-type photodiode structure, it is difficult to improve the sensitivity of the photodiode because the area fraction of an opening or selectively diffused region occupying an incident surface (that is, so-called "fill factor") is small.

In the mesa-type photodiode structure as shown in Patent Document 1, the pixel separation can be realized while having a large fill factor.

However, in the mesa-type photodiode structure, when the p-n junction is exposed on a side surface of the mesa structure, the leakage current is increased. The leakage current is a cause of an increase in dark current. Furthermore, when the p-n junction is exposed to air, moisture or impurities in air adhere to side surfaces of the mesa structure to cause a leakage current. Thus, even though the surface of the p-n junction is covered with a protective film in such a state that a device is completed, the leakage current is increased in some cases.

An aspect of the present invention provides a method for manufacturing a light-receiving device. The method includes the steps of forming a stacked semiconductor layer including a non-doped light-receiving layer on a substrate, the light-receiving layer having an n-type conductivity; forming a selective growth mask made of an insulating film on the stacked semiconductor layer, the selective growth mask having a pattern including a plurality of openings; selectively growing a selective growth layer doped with a p-type impurity on a portion of the stacked semiconductor layer that is exposed through each of the openings using the selective growth mask; and forming a p-n junction in a region of the light-receiving layer by diffusing the p-type impurity doped in the selective growth layer into the light-receiving layer. The p-n junction is formed during growing the selective growth layer. Each of the regions including the p-n junctions corresponds to one of the selective growth layers. In addition, the p-n junction in one of the regions of the light-receiving layer is formed separately from the p-n junctions in the other regions of the light-receiving layer.

According to the above method, after forming the selective growth mask having the pattern including a plurality of openings, the p-n junction is formed in the region of the light-receiving layer by diffusing the p-type impurity doped in the selective growth layer into the light-receiving layer when the selective growth layer is formed in the opening. The selective growth layers are discretely grown depending on the openings. Furthermore, p-type impurity regions are discretely formed in the light-receiving layer depending on the opening pattern by diffusing the p-type impurity doped in the selective growth layer into the light-receiving layer. The diffusion of the p-type impurity from the selective growth layer proceeds significantly in a thickness direction (vertical direction). The diffusion of the p-type impurity from the selective growth layer also proceeds in a horizontal direction. The p-type region formed by the diffusion of the p-type impurity becomes slightly larger than the size of the opening because of the diffusion thereof in the horizontal direction. That is, an end of each p-type region expands slightly out of the edge of a corresponding one of the openings and appears on a top surface of the stacked semiconductor layer under the non-open region of the selective growth mask. Therefore, the end of the p-type region that appear on the top surface of the stacked semiconductor layer is not directly exposed to air and is covered with the selective growth mask made of an insulating film. The light-receiving layer is made of a non-doped semiconductor and has an n-type conductivity. Therefore, a p-n junction is formed at the boundary between the n-type light-receiving layer and the p-type region formed by the diffusion of the p-type impurity. When the top layer of the stacked semiconductor layer has an n-type conductivity, an end of the p-n junction appears on the top surface of the stacked semiconductor layer under the non-open region of the selective growth mask corresponding to the position of the end of the p-type region. For example, when the top layer of the stacked semiconductor layer is the light-receiving layer, the end of the p-n junction appears on the top surface of the light-receiving layer under the non-open region of the selective growth mask. The insulating film is formed in the form of a selective growth mask and is used as a passivation film without being removed in a subsequent manufacturing step. As a result, the end of the p-n junction is not exposed to air during manufacture. In addition, the end of the p-n junction is not exposed to air after the light-receiving device is completed. Thus, contaminants such as oxygen and moisture in air do not adhere to the end of the p-n junction and therefore the dark current can be suppress to a low level.

The selective growth layers are discretely distributed depending on the opening pattern. While the p-n junction extends in the horizontal direction, the p-n junctions in the regions corresponding to the neighboring selective growth layers is separated from each other by setting the distance between the openings to be sufficiently large. This allows the independence of pixels including in the light-receiving device to be ensured.

In the method for manufacturing a light-receiving device according to the present invention, the stacked semiconductor layer may include a non-doped intermediate layer formed on the light-receiving layer. The selective growth mask may be formed on the intermediate layer. The selective growth layer may be selectively grown on a portion of the intermediate layer that is exposed through each of the openings using the selective growth mask.

In accordance with this method for manufacturing a light-receiving device, the concentration of the p-type impurity diffusing from the selective growth layers into the light-receiving layer is adjusted by controlling a thickness of the intermediate layer interposed between the light-receiving layer and the selective growth layer. For example, when the selective growth layers need to be grown at relatively high temperature, the concentration of the p-type impurity diffusing from the selective growth layers into the light-receiving layer can be adjusted by increasing the thickness of the intermediate layer. This allows the p-type impurity to diffuse over a long distance. In addition, the crystallinity of a type-II multi quantum well (MQW) structure is apt to be deteriorated with an increase in impurity concentration. When the light-receiving layer has the type-II MQW structure, the concentration distribution of the p-type impurity can be adjusted using the intermediate layer.

In the method for manufacturing a light-receiving device, the p-n junction may have an end disposed at a surface of the stacked semiconductor layer. The end of the p-n junction is preferably covered with selective growth mask in the step of selectively growing the selective growth layer.

In the method for manufacturing a light-receiving device, in the step of selectively growing the selective growth layer, the p-type impurity may be doped while increasing a concentration of the p-type impurity gradually or in stages from non-doping or slight doping concentration with the elapse of the growth time.

In the method for manufacturing a light-receiving device, the selective growth layer may be grown at a growth temperature of 450° C. to 550° C. by metal-organic vapor phase epitaxy using metal-organic compounds for a III group source material and a V group source material. For example, as a V group source material, tertiarybutylarsine (TBAs) and tertiarybutylphosphine (TBP) are used. TBAs and TBP are source materials of As and P, respectively.

In the method for manufacturing a light-receiving device, the selective growth layer may include at least one of an InGaAs layer, an InP layer, and a composite layer composed of an InGaAs layer and an InP layer. The insulating film constituting the selective growth mask may include one of a silicon nitride (SiN) film, a silicon oxynitride (SiON) film, and a silicon dioxide ($SiO_2$) film. Furthermore, the light-receiving layer may include a type-II multi quantum well structure or a single bulk layer. The type-II multi quantum well structure may be composed of InGaAs layer and GaAsSb layer stacked alternately or GaSb layer and InAs layer stacked alternately.

Another aspect of the present invention provides a light-receiving device including a plurality of arrayed pixels. The light-receiving device includes a stacked semiconductor layer including a light-receiving layer, the light-receiving layer including a p-n junction; an insulating layer disposed on the stacked semiconductor layer, the insulating layer having a pattern including a plurality of openings corresponding to the pixels; and a selective growth layer disposed in the opening of the insulating layer and directly contacting with a surface of the stacked semiconductor layer through the opening, the selective growth layer being composed of a p-type semiconductor layer doped with a p-type impurity. The p-n junction is placed in a region of the light-receiving layer corresponding to each of the selective growth layers. In addition, the p-n junction is spaced from the p-n junction placed in the region corresponding to the neighboring selective growth layer.

In the above configuration, the light-receiving layer extends continuously over the pixels. The independence or separation of the pixels is ensued by the selective growth layers, which are disposed in the opening. The p-n junction is placed in a region of the light-receiving layer corresponding to each of the selective growth layers. The separation of the pixels is ensured by the selective growth layers selectively grown in the openings and the p-n junctions placed in the regions of the light-receiving layers that correspond to the selective growth layers. Herein, the term "region corresponding to the selective growth layer" refers to region of the light-receiving layer that corresponds to region of the opening and that is located under the selective growth layer. Note that the openings and the selective growth layers are discretely arranged, respectively.

In the light-receiving device according to the present invention, the stacked semiconductor layer may include an intermediate layer disposed on the light-receiving layer. The insulating layer may be disposed on the intermediate layer. When the intermediate layer is placed between the light-receiving layer and the selective growth layer, the concentration of the p-type impurity diffusing from the selective growth layer into the light-receiving layer through the intermediate layer is adjusted. That is, the intermediate layer is used to adjust the concentration of the p-type impurity diffusing into the light-receiving layer. As a result, for example, when the light-receiving layer has a type-II MQW structure, the deterioration of crystallinity of the light-receiving layer due to the diffusion of the p-type impurity into the light-receiving layer is suppressed.

In the light-receiving device according to the present invention, the intermediate layer preferably includes a first region in contact with the selective growth layer placed under the opening of the insulating layer and a second region in contact with the insulating layer. The first region of the intermediate layer preferably has a p-type conductivity. The second region of the intermediate layer preferably has an n-type conductivity opposite to the p-type conductivity. In addition, the first region of the intermediate layer is preferably surrounded by the second region of the intermediate layer.

In the light-receiving device, when the intermediate layer is placed between the light-receiving layer and the selective growth layer, the p-type impurity diffuses from the selective growth layer into the light-receiving layer through the intermediate layer. Therefore, the p-type impurity is distributed in a region of the intermediate layer that is in contact with the selective growth layer. A periphery of the p-type region is located under the non-open region of the pattern of the insulating layer. In addition, the periphery of the p-type region has an n-type conductivity opposite to the p-type conductivity because no p-type impurity diffuses into the periphery thereof. Each of the pixels is surrounded by the n-type region; hence, the neighboring pixels are separated from each other.

In the light-receiving device according to the present invention, the p-n junction is preferably placed in a portion of the light-receiving layer that is close to an interface between the light-receiving layer and the intermediate layer. In order to operate the light-receiving device, a reverse bias voltage is applied to the light-receiving device. In this operation, a depletion layer is formed near the p-n junction. Light is absorbed in the depletion layer and therefore photocarriers are generated in the depletion layer, whereby light is converted into an electrical signal. When the p-n junction is located close to the upper surface of the light-receiving layer, the depletion layer can be sufficiently expanded in the light-receiving layer from the p-n junction toward a region having low impurity concentration. This allows the photosensitivity of the light-receiving device to be increased.

In the light-receiving device according to the present invention, the p-n junction preferably has an end disposed at the surface of the stacked semiconductor layer under the insulating layer. In addition, the end of the p-n junction is preferably covered with the insulating layer. In this configuration, the end of the p-n junction placed in the region corresponding to the selective growth layer is covered with the insulating layer and therefore is not exposed to air. Thus, oxygen or the like in air does not adhere to the ends of the p-n junctions and therefore the dark current can be suppressed.

DESCRIPTION OF THE PREFERRED EMBODIMENTS

Findings of the present invention can be readily understood by considering detailed descriptions below with reference to the attached drawings for exemplification. Subsequently, embodiments of the present invention will now be described with reference to the attached drawings. When possible, the same components are given the same reference numerals.

First Embodiment

Figure 1A:
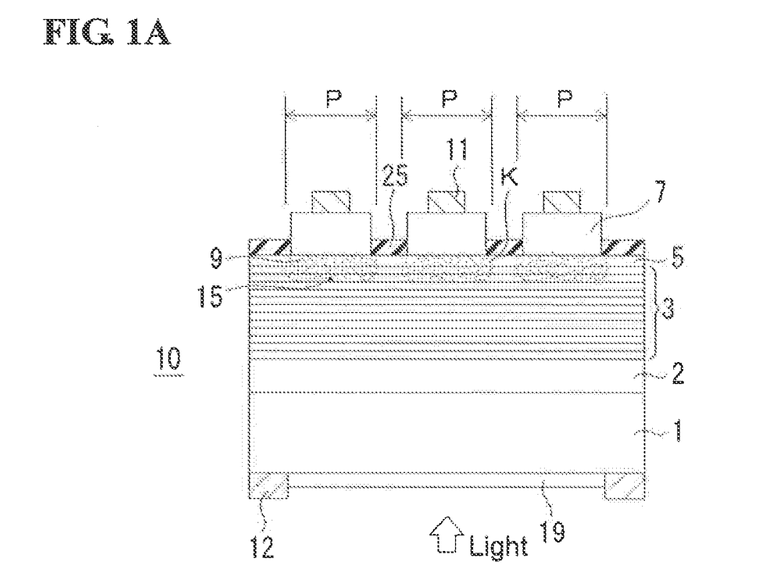
FIG. 1A is a sectional view of a light-receiving device according to a first embodiment of the present invention.
Figure 1B:
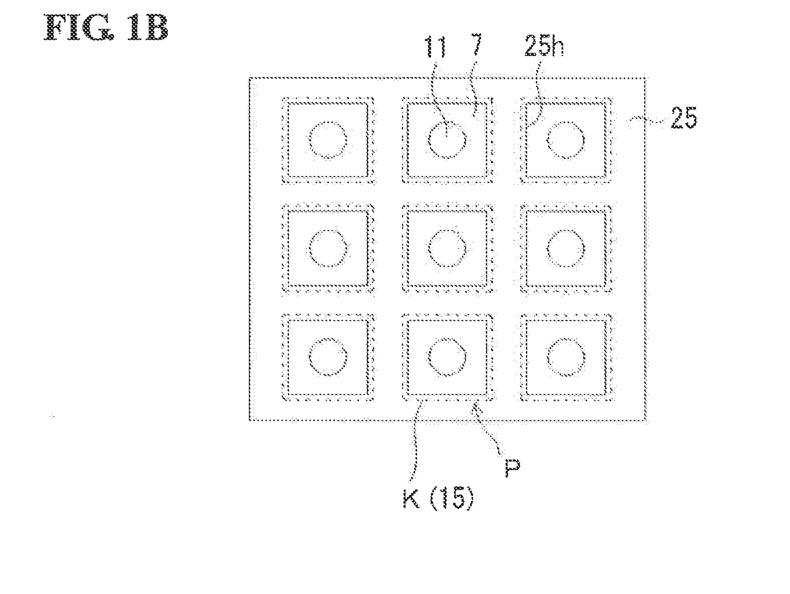
FIG. 1B is a plan view of the light-receiving device according to the first embodiment.

FIG. 1A is a sectional view of a light-receiving device 10 according to a first embodiment of the present invention. FIG. 1B is a plan view of the light-receiving device 10. The light-receiving device 10 includes a substrate 1 and a plurality of pixels P arranged thereon. The pixels P are arranged separately from each other such that received optical signals can be independently detected. Referring to FIG. 1A, the light-receiving device 10 has a stacked semiconductor layer including a buffer layer 2, a type-II MQW light-receiving layer 3, an intermediate layer 5, and selective growth layers 7 formed on the substrate 1.

The buffer layer 2 is made of a III-V group compound semiconductor such as InP, indium aluminum arsenide (InAlAs), or InGaAs. The intermediate layer 5 is made of a III-V group compound semiconductor such as InGaAs or MP Light is incident on the back surface of the substrate 1. The back surface of the substrate 1 is provided with an opening. An antireflective film 19 is placed in the opening. The antireflective film 19 is made of, for example, SiON. The substrate 1 is made of, for example, n-type InP. A ground electrode 12 is formed on the back surface of the substrate 1. The ground electrode 12 is in ohmic contact with the substrate 1. The buffer layer 2 has a conductivity of n-type (second conductivity type). The type-II MQW light-receiving layer 3 has a MQW structure in which non-doped InGaAs layers and no-doped GaAsSb layers are alternately stacked. The type-II MQW light-receiving layer 3 is composed of non-doped semiconductor layers. However, an n-type impurity such as Si is included at a concentration of for example, $1\times10^{16}$ cm$^{-3}$ or less. The intermediate layer 5 is made of a non-doped III-V group compound semiconductor. The intermediate layer 5 has an n-type conductivity and an impurity concentration of for example, $1\times10^{16}$ cm$^{-3}$ or less. As shown in FIG. 1A, the intermediate layer 5 includes p-type (first conductivity type) impurity regions 9 that are separated from each other to correspond to the pixels P. The selective growth layers 7 are formed by epitaxial growth using an insulating layer mask 25 having an opening pattern as a selective mask. The selective growth layers 7 are grown on the intermediate layer 5 through openings 25h in the insulating layer mask 25. The selective growth layers 7 have a p-type conductivity and function as contact layers for p-side electrodes 11 that are pixel electrodes. The p-side electrodes 11 are made of gold-zinc (Au—Zn) and are each arranged on a corresponding one of the selective growth layers 7 so as to be in contact with the selective growth layers 7. The ground electrode 12 is made of gold-germanium-nickel (Au—Ge—Ni) and serves as an n-side electrode. The ground electrode 12 may be placed on an n$^+$-type buffer layer as described below with reference to FIG. 5 and the like. The substrate 1 may be made of semi-insulating InP doped with iron (Fe).

Referring to FIG. 1B, the pixels P are arranged in conformity with the openings 25h in the insulating layer mask 25 in plan view. Strictly speaking, the size of the p-type impurity regions 9 is slightly greater than that of the openings 25h. The openings 25h have a square shape. The pixels P coincide in size with the p-type impurity regions 9 in plan view. The pixels P are arranged at a pitch of for example, 30 μm. The length of a side of each square opening 25h is 20 μm to 25 μm. Each of the pixels P is a single unit in the light-receiving device 10. The pixels P are two-dimensionally arrayed as shown in FIG. 1B, thereby enabling imaging or the like. The shape of the openings 25h is square as described above and may be rectangular or circular.

The pixels P are described below in detail. In this embodiment, the mechanical framework of the pixels P is defined by the selective growth layers 7, which are selectively grown exclusively in the openings 25h in the insulating layer mask 25. The insulating layer mask 25, which has the opening pattern, is formed on the intermediate layer 5. The selective growth layers 7, which are made of, for example, p-type InGaAs, are grown using the insulating layer mask 25 as a selective mask. This results in that the selective growth layers 7 are epitaxially grown on regions of the intermediate layer 5 that are exposed through the openings 25h. An InGaAs layer is not grown on the insulating layer mask 25. Therefore, the selective growth layers 7 are grown in conformity with the openings 25h. In this embodiment, any mesa structure is not formed or any process such as mesa etching is not performed. However, gaps between the selective growth layers 7 may have a structure similar to a mesa groove.

A p-n junction formed in each pixel P is described below. The p-n junctions or pi junctions are formed in the pixels P for the purpose of forming depletion layers in the type-II MQW light-receiving layer 3. When light is incident on the type-II MQW light-receiving layer 3, photocarriers are generated and are converted into electrical signals depending on the intensity of the incident light. The p-n junctions need to be separated from each other depending on the pixels P. In this embodiment, the selective growth layers 7 are doped with zinc (Zn), which is a p-type (first conductivity type) impurity, when the selective growth layers 7 are epitaxially grown at a growth temperature of 450° C. or higher. During the growth of the selective growth layers 7, Zn atom in the selective growth layers 7 thermally diffuses into the intermediate layer 5 and the type-II MQW light-receiving layer 3. The intermediate layer 5 and the type-II MQW light-receiving layer 3, which are non-doped semiconductor layers, contain a slight amount of the n-type impurity as described above. The intermediate layer 5 and the type-II MQW light-receiving layer 3 are not intentionally doped with any impurity in the epitaxial growth process. However, the intermediate layer 5 and the type-II MQW light-receiving layer 3 are contaminated with, for example, silicon (Si) at a concentration of about $1 \times 10^{16}$ $cm^{-3}$. Si impurity serves as an n-type impurity. Therefore, in the case of forming an intrinsic (i-type) semiconductor layer which is not intentionally doped with any impurity, an $n^-$-type semiconductor layer containing a slight amount of an n-type impurity is formed. This is a phenomenon occurring regardless of an intermediate layer or a light-receiving layer. The impurity concentration of such a non-doped semiconductor layer is referred to as "background concentration" and is about $1 \times 10 \, cm^{-3}$ as described above.

Since Zn impurity diffuses from the selective growth layers 7 as described above, the p-type impurity regions 9 are formed so as to extend from bottom portions of the selective growth layers 7 into the intermediate layer 5. Peripheral regions of the p-type impurity regions 9 are located under a non-open region of the insulating layer mask 25. Therefore, n-type regions having an n-type conductivity are formed in the peripheral regions of the p-type impurity regions 9 because the p-type impurity (Zn) does not diffuse in the peripheral regions thereof. The n-type regions surround the p-type impurity regions 9 and therefore the neighboring pixels P are separated from each other. In this embodiment, p-type regions formed in the intermediate layer 5 correspond to first regions. In the intermediate layer 5, the n-type regions, which are located under the non-open region of the insulating layer mask 25, correspond to second regions.

Furthermore, Zn atom diffuses into the type-II MOW light-receiving layer 3 through the intermediate layer 5. As a result, p-n junctions 15 are formed at positions close to the upper surface of the type-II MQW light-receiving layer 3. The p-n junctions 15 are formed at a position where the concentration of a first conductivity-type impurity (for example, Zn) diffusing from is equal to the background concentration of a second conductivity-type impurity (for example, Si) in the type-II MQW light-receiving layer 3. Therefore, the p-n junctions 15 can be regarded as pi junctions. However, the p-n junctions 15 and pi junctions are not distinguished from each other and are collectively referred to as p-n junctions.

When electric fields are applied to the p-n junctions 15 by applying reverse bias voltages between the ground electrode 12 and the p-side electrodes 11, depletion layers are greatly formed so as to extend from the p-n junctions 15 toward low-concentration impurity regions, that is, dilute impurity regions. That is, the depletion layers are formed toward the lower surface of the type-II MQW light-receiving layer 3. When light is incident on the back surface of the substrate 1 and is absorbed in the depletion layers, electron-hole pairs are generated. Then, electrons and holes migrate toward the ground electrode 12 and the p-side electrodes 11, respectively, whereby charges are accumulated in proportion to the amount of received light. Only after incident light is converted into an electrical signal in the depletion layers, a light-receiving phenomenon can be captured. Owing to the depletion layers, which correspond to the pixels P, electrical signals are obtained in proportion to the amount of received light. The intensity distribution of the electrical signals is two-dimensionally obtained, thereby enabling imaging or the like.

The separation of the pixels P from the p-n junctions 15 described above is described in detail in a manufacturing method below. In the description thereof, the suppression of the dark current that is one of objects of the present invention is also described.

FIGS. 2A to 2D are schematic views illustrating a method for manufacturing the light-receiving device 10. Properties such as layer thickness and impurity concentration are exemplified in an example below. For growing an epitaxial layer, metal-organic vapor phase epitaxy (MOVPE) method using metal-organic compounds for a HI group source material and a V group source material is used. The following materials are used as III group source materials: for example, metal-organic materials such as trimethyl indium (TMIn), which is used as a source of In, trimethyl gallium (TMGa), which is used as a source of Ga, and trimethyl aluminum (TMAl), which is used as a source of Al. For V group source materials, tertiary-butyl arsine (TBAs) is used as a source of As and tertiary-butyl phosphine (TBP) is used as a source of P. Molecules of metal-organic compounds used as source materials in MOVPE have large sizes and decompose at low temperatures; hence, the metal-organic compounds are used to grow semiconductor layers. In MOVPE using TBAs and TBP, a semiconductor layer is grown at relatively lower temperature as compared with MONTE using $AsH_3$ and $PH_3$. Thus, MOVPE using TBAs and TBP is used as a preferred method for manufacturing the light-receiving device 10.

Figure 2A:
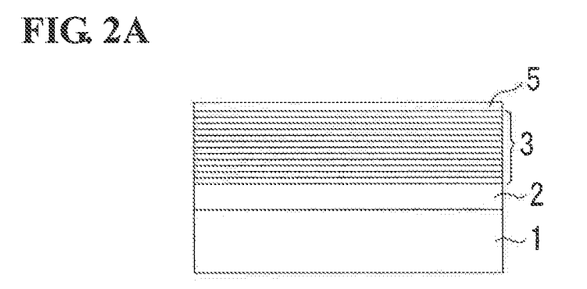
FIGS. 2A to 2D are illustrations showing a method for manufacturing the light-receiving device shown in FIG. 1A.
Figure 2B:
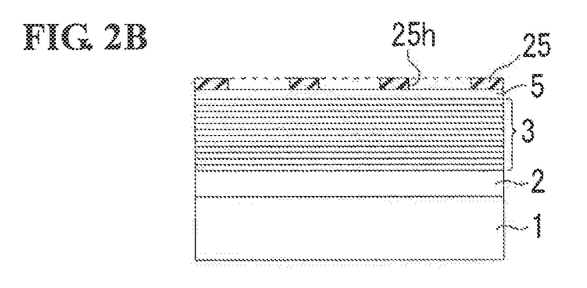
Figure 3:
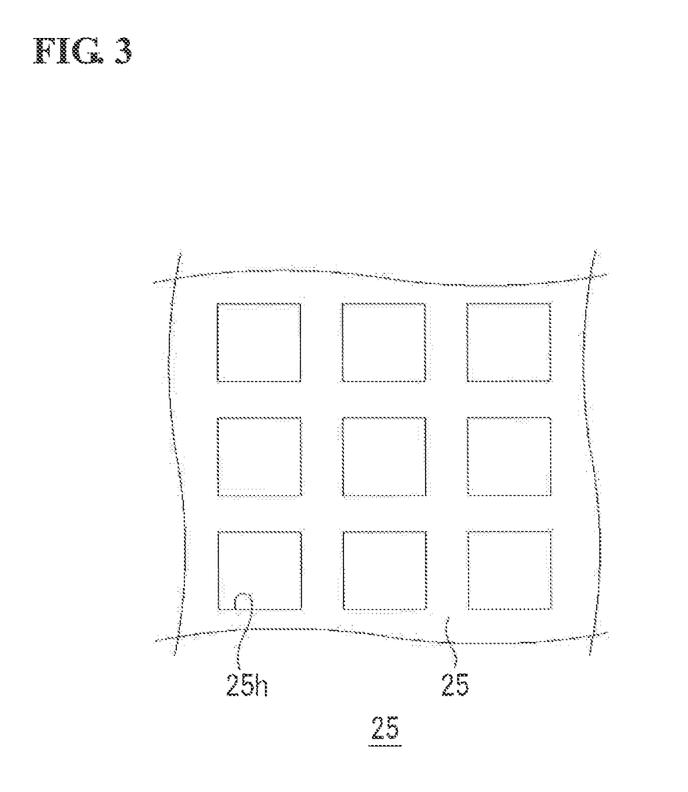
FIG. 3 is a plan view illustrating an opening pattern of an insulating layer mask shown in FIG. 1B.

As shown in FIG. 2A, the following layers are epitaxially grown on the substrate 1: the buffer layer 2, the type-II MQW light-receiving layer 3, and the intermediate layer 5, The substrate 1 and the buffer layer 2 are composed of an n-type semiconductor doped with an n-type impurity. The type-II MQW light-receiving layer 3 and the intermediate layer 5 are composed of a non-doped semiconductor. The buffer layer 2 is made of a III-V group compound semiconductor such as InP, InAlAs, or InGaAs. The number of pairs of InGaAs and GaAsSb in the type-II MQW light-receiving layer 3 is about 50 to 500. The intermediate layer 5 is made of a III-V group compound semiconductor such as non-doped InGaAs or InP. The insulating layer mask 25, which has the opening pattern, is formed on the intermediate layer 5. The insulating layer mask 25 is made of, for example, SiN, SiON, $SiO_2$, or the like. FIG. 3 illustrates the opening pattern of the insulating layer mask 25. The length of a side of each square opening 25h is 20 µm to 25 µm as described above. The horizontal and vertical pitch between the openings 25h is about 30 µm. Referring to FIGS. 3 and 1B, each of the openings 25h corresponds to a central region of a corresponding one of the pixels P in plan view. FIG. 2B is an illustration showing a state in which the insulating layer mask 25 is placed on the intermediate layer 5.

Thereafter, the selective growth layer 7 is grown using diethyl zinc (DEZn) as a p-type impurity source material. The selective growth layer 7 is made of InGaAs or InP. The selective growth layer 7 may include composite layer composed of InGaAs layer and InP layer. The selective growth layer 7 is epitaxially grown on a portion of the intermediate layer 5 that is exposed through the openings 25h of the insulating layer mask 25. The selective growth layer 7 is not grown on the insulating layer mask 25 which is made of an insulating film. The growth temperature of the selective growth layers 7 is preferably 450° C. to 550° C. Since this relatively low growth temperature is used, the crystallinity of the type-II MQW light-receiving layer 3 is not deteriorated and the crystallinity of the selective growth layers 7 is maintained well. Furthermore, the p-type impurity source material of DEZn is decomposed into Zn within such a temperature range; hence, Zn atom diffuses from the bottom portion of the selective growth layer 7 into the type-II MQW light-receiving layer 3 while the p-type impurity region 9 is formed in the intermediate layer 5.

Figure 2C:
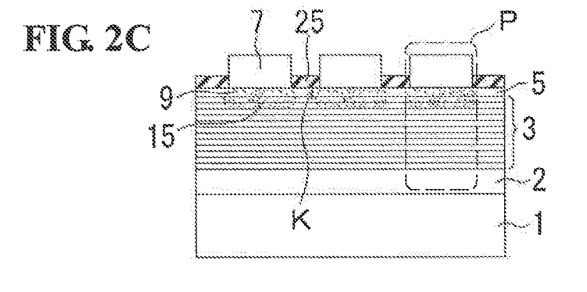

The concentration and diffusion depth of Zn impurity in the type-II MQW light-receiving layer 3 is controlled by adjusting the thickness of the intermediate layer 5. When the selective growth layer 7 is grown at, for example, the above growth temperature by MOVPE, the concentration of Zn impurity in a portion close to the upper surface of the type-II MQW light-receiving layer 3 is adjusted to about $1 \times 10^{16}$ cm$^{-3}$, which is substantially the same concentration as the background concentration of the n-type impurity in the type-II MQW light-receiving layer 3. This allows the p-n junctions 15 to be placed at desired positions in the type-II MQW light-receiving layer 3. Referring to FIG. 2C, the p-n junctions 15 are placed in the type-II MQW light-receiving layer 3. Furthermore, an end K of each p-n junction 15 is located on the intermediate layer 5. The p-type impurity (Zn) diffuses from the selective growth layers 7 mainly in the thickness direction (vertical direction) thereof and also diffuses slightly in the horizontal direction (direction along a surface of each layer). Therefore, the p-type impurity regions 9 are slightly wider than the insulating layer mask 25 in plan view. As a result, the ends K of the p-n junctions 15 are located on the intermediate layer S and are covered with the insulating film, that is, the non-open region of the insulating layer mask 25. Therefore, any contaminants such as oxygen in air do not adhere to the ends K of the p-n junctions 15. Referring to FIG. 2C, a thick broken line defines the extent of each pixel P. The extent of each p-type impurity region 9 corresponds to that of a corresponding one of the pixels P. Thereafter, each of the p-side electrodes 11 is formed on a corresponding one of the selective growth layers 7, whereby the light-receiving device 10 is completed as shown in FIG. 1A. In this operation, the selective growth layers 7 function as contact layers and the p-side electrodes 11 form ohmic contacts with the selective growth layers 7. The insulating layer mask 25 is left in the light-receiving device 10 so as to make it function as a passivation film.

Figure 4A:
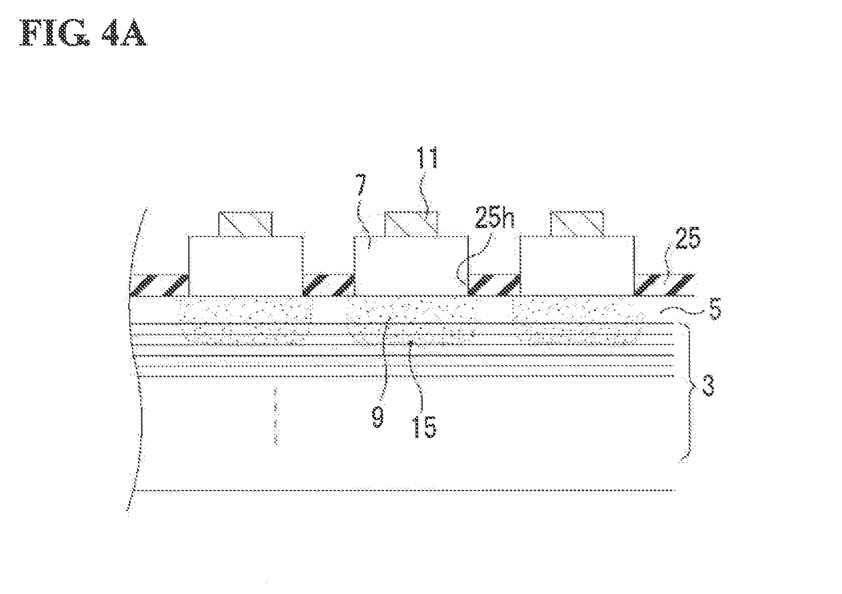
FIG. 4A is a schematic view illustrating p-type regions and p-n junctions formed using selective growth layers as diffusion sources.
Figure 4B:
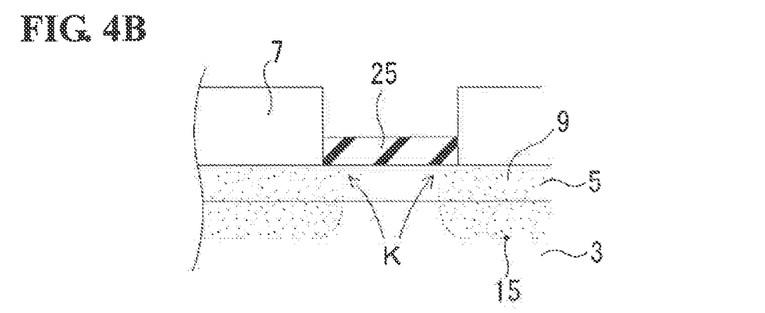
FIG. 4B is a partly enlarged view of an end of a p-n junction.

The suppression of the dark current that is one of objects of the present invention is described below. When the ends K of the p-n junctions 15 contact air, oxygen and the like in air adhere to the ends K of the p-n junctions 15 to cause an increase in dark current. Therefore, it is insufficient to only prevent the ends K of the p-n junctions 15 from being exposed to air at the completion of the light-receiving device 10. If the ends K of the p-n junctions 15 are exposed to air or an atmosphere in a growth chamber of a growth system even for a moment during manufacture, then contaminants such as oxygen adhere to the ends K of the p-n junctions 15. Thus, the following structure is needed: a structure preventing the p-n junctions 15 from being exposed to air or the atmosphere in a growth chamber in every stage during manufacture. In this embodiment, the ends K of the p-n junctions 15 appear on a surface of the intermediate layer 5 at the point of forming the p-n junctions 15 by diffusing Zn impurity from the selective growth layers 7 into the type-II MQW light-receiving layer 3 as shown in FIG. 2C. FIGS. 4A and 4B show a state in which the ends K of the p-n junctions 15 appear on a surface of the intermediate layer 5. At this point of forming the p-n junctions 15, the ends K of the p-n junctions 15 have been covered with the insulating film or the non-open region of the insulating layer mask 25. The insulating layer mask 25 is left in the light-receiving device 10 as a passivation Therefore, the ends K of the p-n junctions 15 are not exposed to air or the like thereafter. This results in that the ends K of the p-n junctions 15 are not exposed to air or the atmosphere in the growth chamber and therefore the dark current can be maintained low.

Major portions of the pixels P are formed due to the selective growth layers 7, which are discrete as described above. In order to allow one of the pixels P to function independently of the other pixels P, the p-n junction 15 of this pixel P needs to be electrically separated from the p-n junctions 15 of the pixels P next to this pixel P. The neighboring pixels P are close to each other as shown in FIG. 4B because of the horizontal diffusion of the p-type impurity. However, the pixels P are reliably separated from each other in such a way that the pitch between the selective growth layers 7 or the openings 25h is maintained at a certain level or more.

A method for forming the type-II MQW light-receiving layer 3 is described below. When the light-receiving layer 3 has a type-II MQW structure, the light-receiving layer 3 includes a superlattice structure (MQW structure) constituted by two or more kinds of semiconductor layers having different compositions which are alternately stacked. Each of the different semiconductor layers constituting the superlattice structure (MQW structure) has a thickness of several nanometers. In this embodiment, the superlattice structure (MQW structure) is constituted by InGaAs layers and GaAsSb layers stacked alternately. The crystallinity of the type-II MQW structure is not so stable. For example, when the type-II MQW structure is held at a temperature higher than a predetermined temperature, the crystallinity thereof is deteriorated, in the case of heavily doping the type-II MQW structure with an impurity, the crystallinity thereof is also deteriorated due to the influence of the diffusion of the impurity. Examples of the deterioration of the crystallinity thereof include the decomposition of the layer configuration of the type-II MQW structure and the disruption in the crystal lattice (lattice disorder). The influence of temperature on the deterioration of crystallinity is reduced by selecting a growth method capable of growing a semiconductor layer having a good crystalline even at a low growth temperature. The growth temperature for growing the intermediate layer 5 and the selective growth layers 7 is, for example, 600° C. or lower and is more preferably 550° C. or lower. This growth temperature may be realized by MOVPE method using TBAs and TBP as a V group source material.

On the other hand, for reducing the influence of the concentration of an impurity on the deterioration of crystallinity, the thickness of the intermediate layer 5 is preferably adjusted such that the p-type (first conductivity type) impurity does not excessively diffuse into the type-II MQW light-receiving layer 3 during growing the selective growth layers 7. In other words, the intermediate layer 5 is used as a layer for adjusting the concentration distribution of the p-type impurity. In this case, the concentration of Zn impurity in the intermediate layer 5 decreases monotonically from the selective growth layers 7, which serve as diffusion sources, toward the type-II MQW light-receiving layer 3. However, Zn atom is piled up at heterointerfaces and therefore small peaks appear locally in some cases. In the interface between the intermediate layer 5 and the type-II MQW light-receiving layer 3, even if pile-up occurs at a heterointerface, such pile-up is limited in a local range in terms of the concentration distribution of an impurity. Therefore, the concentration of the p-type impurity in a portion of the intermediate layer 5 that is close to the interface between the intermediate layer 5 and the type-II MQW light-receiving layer 3 is adjusted to $5 \times 10^{16}$ cm$^{-3}$ or less. This allows the concentration of the p-type impurity in the above-mentioned portion to be $5 \times 10^{16}$ cm$^{-3}$ or less, including the influence of pile-up at a heterointerface. Since the background concentration of the n-type impurity in the type-II MQW light-receiving layer 3 is about $1 \times 10^{16}$ cm$^{-3}$, the p-n junctions 15 are formed in regions of the type-II MQW light-receiving layer 3 that are close to the intermediate layer 5.

For the different semiconductor layers constituting the type-II MQW structure, a combination of materials of, for example, (InGaAs/GaAsSb), (GaSb/InAs), and the like is used. For a (InGaAs/GaAsSb) type-II MQW structure, an InP substrate is used as a substrate. For a (GaSb/InAs) type-II MQW structure, an epitaxial substrate including a semiconductor layer made of a III-V group compound semiconductor such as InGaAs or GaAsSb formed on a InGaAs substrate, a gallium arsenide (GaAs) substrate, or an InP substrate may be used.

In the case (case S2) where the intermediate layer 5 is formed between the type-II MQW light-receiving layer 3 and the selective growth layers 7, the concentration of the p-type impurity in the type-II MQW light-receiving layer 3 is adjusted to be low due to the above-mentioned structure. Even in the case (case S1) where the intermediate layer 5 is not formed between the type-II MQW light-receiving layer 3 and the selective growth layers 7, the concentration of the p-type impurity (first conductivity-type impurity) in the type-II MQW light-receiving layer 3 is controlled in such a way that the amount of the doped p-type impurity is gradually or stepwise increased from non-doping or slight doping with the elapse of the growth time in a step of forming the selective growth layers 7.

According to the above-mentioned way to adjust the amount of the doped p-type impurity, the amount of diffusion of the first conductivity-type impurity in the type-II MQW light-receiving layer 3 is adjusted to be low particularly in the case (case S1) where the intermediate layer 5 is not formed. Therefore, even in the case (case S1) where the intermediate layer 5 is not formed, the type-II MQW light-receiving layer 3 is formed so as to have good crystallinity. In the case (case S2) where the intermediate layer 5 is formed, the above-mentioned doping method in the case S1 may be used. When a region with low impurity concentration is present in a light-receiving device, the electrical resistance of the light-receiving device is large. However, even when a region with low p-type impurity concentration is present, the increase of the electrical resistance is suppressed by using a semiconductor material (for example, InGaAs) with relatively high electrical conductivity at a low impurity concentration for growing the selective growth layers 7.

Figure 5:
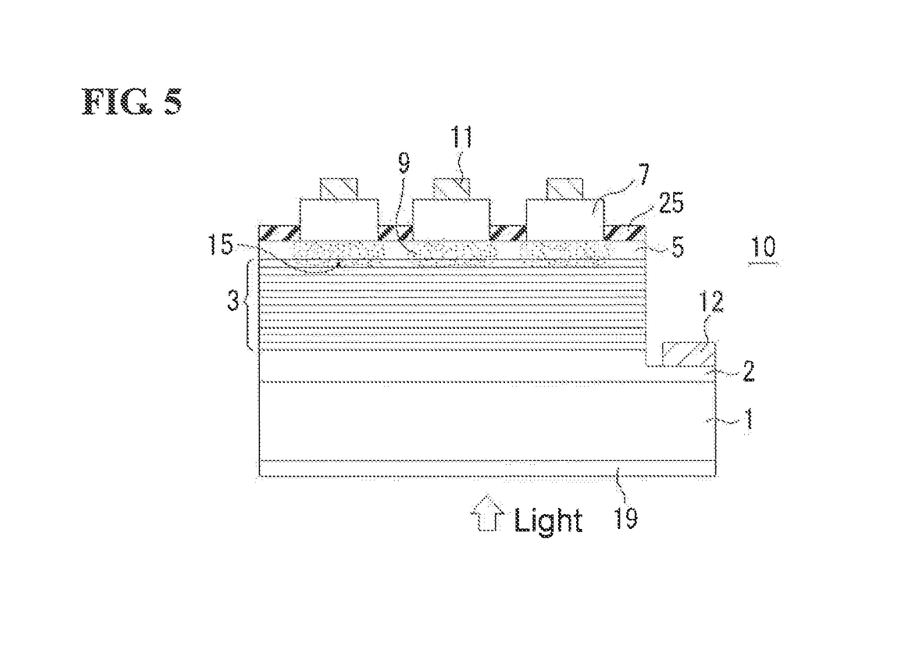
FIG. 5 is an illustration showing a modification of the light-receiving device according to the first embodiment.

FIG. 5 shows a modification of the light-receiving device 10 shown in FIG. 1A and an embodiment of the present invention. In the modification, the position of a ground electrode 12 and the conductivity type of a substrate 1 are different from those of the light-receiving device 10 shown in FIG. 1A. The ground electrode 12 is formed so as to be in ohmic contact with an n$^+$-type buffer layer 2. In this case, the substrate 1 may be a semi-insulating InP substrate doped with Fe impurity. The semi-insulating IMP substrate transmits light in the near-infrared region while hardly absorbing the light and therefore is preferably used in the light-receiving device 10 such that light is incident on the back surface of the semi-insulating InP substrate.

Figure 6:
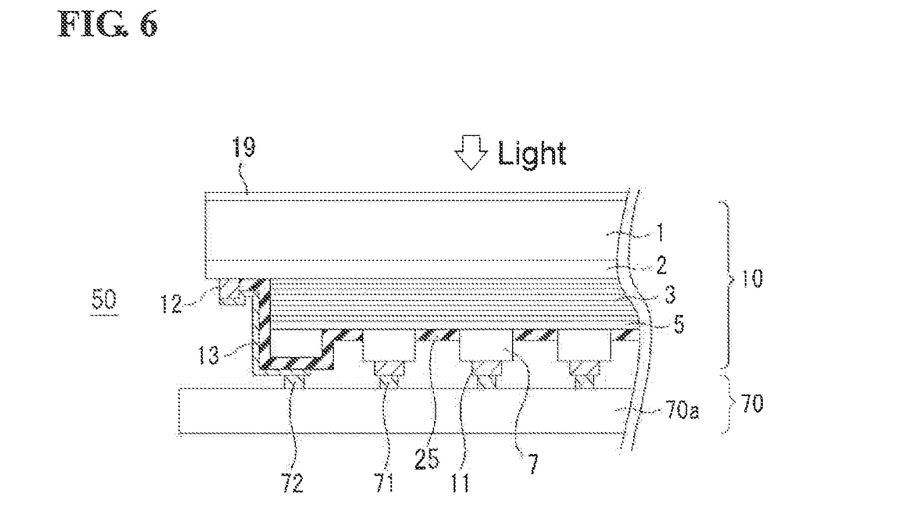
FIG. 6 is an illustration showing a sensing system manufactured by assembling a light-receiving device according to the modification shown in FIG. 5 with a read-out integrated circuit.

In the case of manufacturing a sensing system by assembling a light-receiving device 10 according to the modification with a read-out integrated circuit (ROIC), a simple interconnect structure is obtained. FIG. 6 is an illustration showing a sensing system 50 manufactured by assembling the light-receiving device 10 according to the modification shown in FIG. 5 with a read-out integrated circuit 70.

A ground electrode 12 of the light-receiving device 10 is placed on the buffer layer 2 and a wiring electrode 13 is routed on an insulating film at an end of an insulating layer mask 25 so as to be level with pixel electrodes 11; hence, the wiring electrode 13 is opposed to a ground electrode 72 of a read-out integrated circuit body 70a. The wiring electrode 13 is electrically connected to the ground electrode 72 of the read-out integrated circuit body 70a using bonding humps (not shown). Each of the bonding bumps is preferably placed on a corresponding one of the ground electrode 72 of the read-out integrated circuit body 70a and the wiring electrode 13 of the light-receiving device 10, Similarly, the pixel electrodes 11 are electrically connected to read-out electrodes 71 of the read-out integrated circuit 70 in such a way that each of bonding bumps (not shown) is placed on a corresponding one of the pixel electrodes 11 and the read-out electrodes 71.

The application of the above-mentioned structure to the light-receiving device 10 of the sensing system 50 allows the sensing system 50 to have low dark current, good pixel separation, and high sensitivity. The sensing system 50 has good sensitivity to wavelengths in the near-infrared to infrared region.

Second Embodiment

Figure 7:
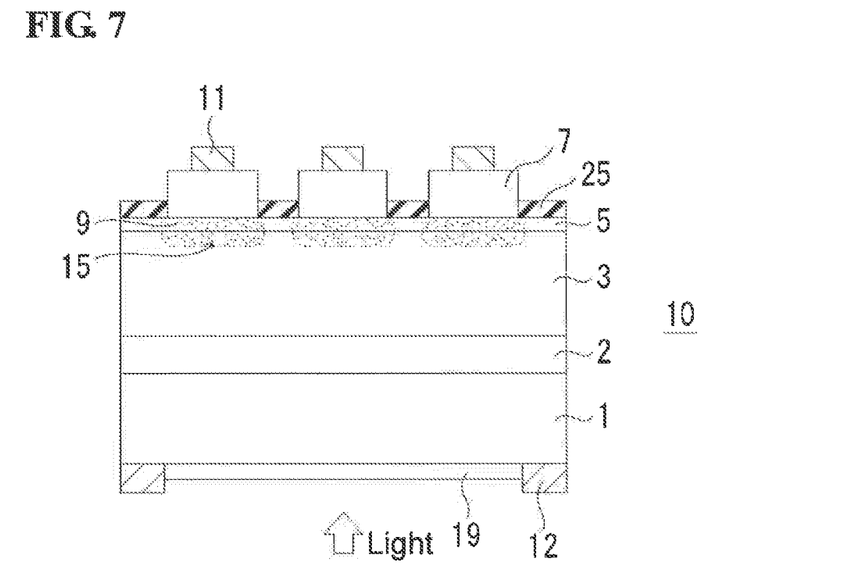
FIG. 7 is a sectional view of a light-receiving device according to a second embodiment of the present invention.

FIG. 7 is a sectional view of a light-receiving device 10 according to a second embodiment of the present invention. This embodiment is different from the first embodiment in that an InGaAs light-receiving layer 3 is used. Other components are common to the first embodiment. The light-receiving device 10 has a III-V group semiconductor multilayer structure including a substrate 1, a buffer layer 2, the InGaAs light-receiving layer 3, an intermediate layer 5, and selective growth layers 7.

The buffer layer 2 is made of a III-V group compound semiconductor such as InP, InAlAs, or InGaAs. The intermediate layer 5 is made of a III-V group compound semiconductor such as InGaAs or InP. The basic configuration of pixels P, the formation of p-n junctions 15, and the reduction of the dark current described in the first embodiment are common and applied to this embodiment. However, the InGaAs light-receiving layer 3 is a single bulk layer and therefore has relatively stable crystallinity as compared to light-receiving layers with a type-II MQW structure. In order to achieve more preferable crystallinity, it is preferred that the growth temperature of the intermediate layer 5 and the selective growth layers 7, which are formed on the InGaAs light-receiving layer 3, is low and the impurity concentration of the InGaAs light-receiving layer 3 is low.

Third Embodiment

Figure 8:
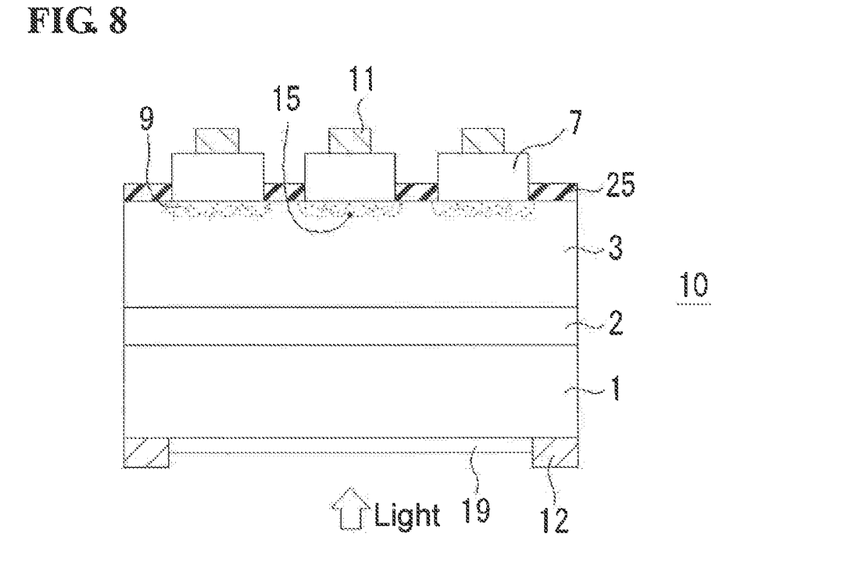
FIG. 8 is a sectional view of a light-receiving device according to a third embodiment of the present invention.

FIG. 8 is a sectional view of a light-receiving device 10 according to a third embodiment of the present invention. This embodiment is different from the first embodiment in that an InGaAs light-receiving layer 3 is used and no intermediate layer is used. Other components are common to the first embodiment. The light-receiving device 10 has a III-V group semiconductor multilayer structure including a substrate 1, a buffer layer 2, the InGaAs light-receiving layer 3, and selective growth layers 7.

The buffer layer 2 is made of a III-V group compound semiconductor such as InP, InAlAs, or InGaAs. In this embodiment, the selective growth layers 7 are epitaxially grown directly on the InGaAs light-receiving layer 3, which is used as a base layer. This embodiment corresponds to the case (case S1) where no intermediate layer is formed.

Fourth Embodiment

Figure 9:
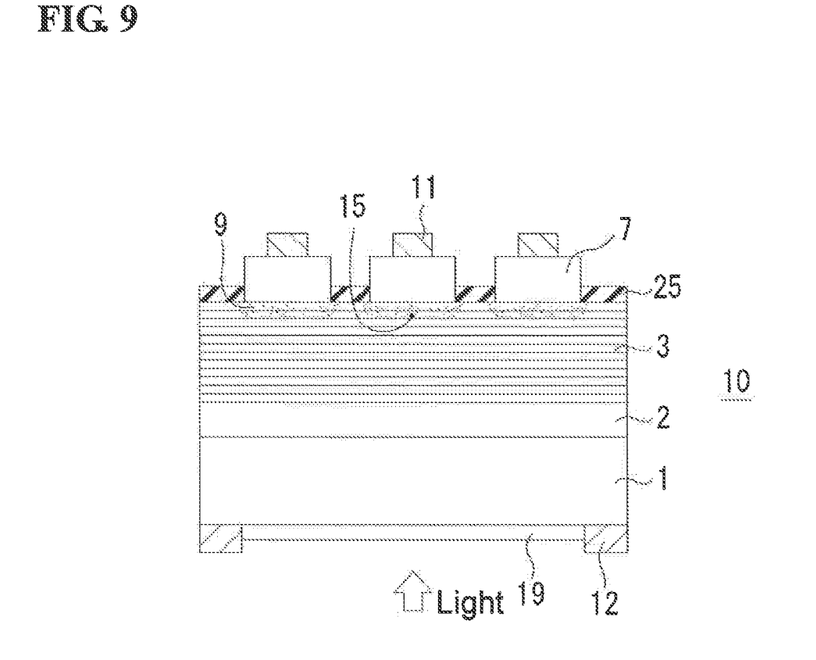
FIG. 9 is a sectional view of a light-receiving device according to a fourth embodiment of the present invention.

FIG. 9 is a sectional view of a light-receiving device 10 according to a fourth embodiment of the present invention. This embodiment is different from the first embodiment in that no intermediate layer is used. Other components are common to the first embodiment. The light-receiving device 10 has a III-V group semiconductor multilayer structure including a substrate 1, a buffer layer 2, a type-II MQW light-receiving layer 3, and selective growth layers 7. In the embodiment, the type-II MQW light-receiving layer 3 is constituted by InGaAs layers and GaAsSb layers stacked alternately (type-II (InGaAs/GaAsSb) MQW structure).

The buffer layer 2 is made of a III-V group compound semiconductor such as InP, InAlAs, or InGaAs. In this embodiment, the selective growth layers 7 are epitaxially grown directly on the type-II MQW light-receiving layer 3, which is used as a base layer. In this case, no intermediate layer is used. Therefore, the amount of a doped p-type impurity is preferably adjusted when the selective growth layers 7 are formed. The following method is preferably taken: a method to gradually or stepwise increase the amount of doped Zn (p-type impurity) from zero with the elapse of the growth time of the selective growth layers 7. Alternatively, the amount of the doped p-type impurity may be maintained at a certain level during the growth of the selective growth layers 7, may be maintained at a certain level in the initial stage of the growth thereof, or may be adjusted to a certain level in the final stage of the growth thereof. This method enables the concentration of the p-type impurity in the type-II MQW light-receiving layer 3 to be controlled to be low and also allows p-n junctions 15 in the type-II MQW light-receiving layer 3 to be placed close to the selective growth layers 7 even though no intermediate layer is formed. The p-n junctions 15 are formed at a position where the concentration of the p-type impurity is equal to $1 \times 10^{16}$ cm$^{-3}$, which is the background concentration of an n-type impurity in the type-II MQW light-receiving layer 3.

EXAMPLE

A light-receiving device 10 is experimentally manufactured as shown in FIGS. 1A and 1B. A basic method for manufacturing the light-receiving device 10 is as outlined in the first embodiment and therefore matters concerning properties such as thickness are described in this example.

(Step Shown in FIG. 2A)

MOVPE using TBAs and TBP is used as an epitaxial growth method, n-type InGaAs buffer layer 2 is grown on a substrate 1 so as to have a thickness of 0.5 μm. The substrate 1 is made of, for example, n-type InP doped with S impurity. The impurity concentration of the n-type InGaAs buffer layer 2 is adjusted to $1.5 \times 10^{18}$ cm$^{-3}$. The impurity concentration of the n-type InGaAs buffer layer 2 may range from $1 \times 10^{18}$ cm$^{-3}$ to $2 \times 10^{18}$ cm$^{-3}$. A light-receiving layer 3 having a type II-MQW structure is grown on the n-type InGaAs buffer layer 2. In growing the light-receiving layer 3, non-doped InGaAs layers (5 nm) and non-doped GaAsSb layers (5 nm) are alternately grown. The number of pairs of InGaAs layer (5 nm) and GaAsSb layer (5 nm) is 250. An intermediate layer 5 is grown on the light-receiving layer 3 using non-doped InP so as to have a thickness of 0.1 μm. Alternatively, InGaAs may be used to form the intermediate layer 5.

(Step Shown in FIG. 2B)

Next, a SiN film for forming an insulating layer mask 25 is formed on an epitaxial wafer having the semiconductor layers including the buffer layer 2, the light-receiving layer 3, and the intermediate layer 5 grown on the substrate 1 so as to have a thickness of 0.1 μm. A plasma-enhanced chemical vapor deposition (PECVD) method is used to form the SiN film. The SiN film is etched by photolithography using a resist mask, whereby rectangular-shape openings 25h with a 22.5 μm side are two-dimensionally formed at a pitch of 30 μm. Buffered hydrofluoric acid is used for forming the openings 25h in the SiN film as an etchant, for example. The openings 25h preferably have a square shape and may have a square-like shape. The length of a side of each opening 25h may range from 20 μm to 25 μm. The shape of the openings 25h need not be rectangular and may be circular. When the openings 25h have a circular shape, the diameter thereof may range from 20 μm to 25 μm. In this way, 11 units each including the openings 25h arranged in 320 rows and 256 columns are formed on a surface of the epitaxial wafer. This corresponds to 11 light-receiving devices.

(Step Shown in FIG. 2C)

The epitaxial wafer provided with the insulating layer mask 25 having an opening pattern is loaded into a growth chamber of an MOVPE growth system, whereby a p-type InGaAs layer corresponding to the selective growth layer 7 is selectively grown by using the insulating layer mask 25 as a selective growth mask. The concentration of a p-type impurity (Zn) in the p-type InGaAs layer (the selective growth layer 7) is about $3.5 \times 10^{18}$ cm$^{-3}$. The concentration of the p-type impurity in the selective growth layer 7 may range from $1 \times 10^{18}$ cm$^{-3}$ to $1 \times 10^{19}$ cm$^3$. The thickness of the selective growth layers 7 is 0.4 μm. The thickness thereof may be selected from the range of 0.1 μm to 1.5 μm depending on the growth temperature of the selective growth layers 7. The growth temperature thereof is about 500° C. In the step of growing the selective growth layers 7, no semiconductor layer is epitaxially grown on the SiN film corresponding to a non-open region of the insulating layer mask 25 and the selective growth layer 7 is epitaxially grown on the intermediate layer 5 in the rectangular-shape openings 25h.

In the MOVPE used to form the intermediate layer 5 and the selective growth layers 7 after the formation of the light-receiving layer 3, TBAs and TBP are preferably used as a source of As and a source of P, respectively. This enables epitaxially growth at a relatively low growth temperature of 600° C. or lower, preferably 550° C. or lower. As a result, the crystallinity of the light-receiving layer 3, which is located under the intermediate layer 5, is not deteriorated. Although the p-type impurity, Zn, diffuses toward the light-receiving layer 3 during the growth of the selective growth layers 7 as described above, the concentration of Zn impurity in the intermediate layer 5 decreases. Furthermore, the concentration of Zn impurity in a portion of the intermediate layer 5 that is close to the interface between the intermediate layer 5 and the light-receiving layer 3 is low, about $5\times10^{16}$ cm$^{-3}$. Therefore, the crystallinity of the light-receiving layer 3 is not deteriorated. The p-type impurity used in this example is Zn and may be carbon or the like.

Furthermore, p-n junctions 15 are formed in the light-receiving layer 3 by the diffusion of Zn atom during the growth of the selective growth layers 7. The background concentration of an n-type impurity in the light-receiving layer 3 is about $1\times10^{16}$ cm$^{-3}$. The p-n junctions 15 are formed at a position where the concentration of Zn impurity is equal to the background concentration of the n-type impurity in the light-receiving layer 3. That is, the p-n junctions 15 are formed at a position where the concentration of Zn impurity and the background concentration of the n-type impurity cross.

An end K of each p-n junction 15 appears on a surface of the intermediate layer 5. However, the insulating layer mask 25 covers a surface of the intermediate layer 5 and remains as a passivation film. Thus, the ends K of the p-n junctions 15 are not exposed to air or an atmosphere in the growth chamber until the light-receiving device 10 is completed after the p-n junctions 15 are formed during manufacture. Therefore, contaminants such as oxygen do not adhere to the ends K thereof and the increase of the dark current is suppressed.

Figure 2D:
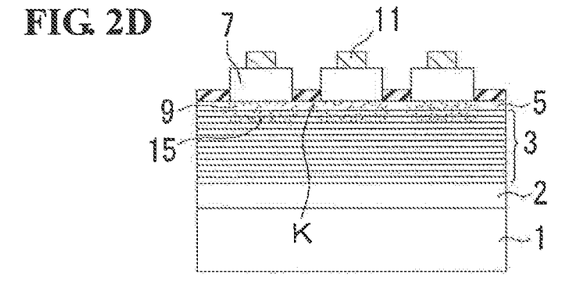

Thereafter, in a step shown in FIG. 2D, p-side electrodes 11 are each formed on a corresponding one of the selective growth layers 7.

In order to manufacture the light-receiving device 10 used in the sensing system 50 shown in FIG. 6, mesa walls are formed so as to surround pixels arranged in 320 rows and 256 columns as described above and so as to extend into the buffer layer 2. An n-side electrode 12 is formed on the exposed buffer layer 2. In the sensing system 50 shown in FIG. 6, a wiring electrode 13 is routed up to the upper bases of the mesa walls so as to be level with the p-side electrodes 11. On the other hand, in the case of assembling the light-receiving device 10 shown in FIG. 1 with a read-out integrated circuit, a ground electrode 12 placed on the back surface of the substrate 1 is electrically connected to a ground electrode 72 of a read-out integrated circuit body 70a through a wire such as a gold wire.

In the above example and embodiments, no infrared light-receiving device is Described. A mid- to far-infrared light-receiving device 10 may be manufactured using a type-II (InAs/GaSb) MQW light-receiving layer.

While the embodiments and example of the present invention have been described above, the embodiments and example of the present invention are for exemplification only. The scope of the present invention is not limited to the embodiments and example of the present invention. The scope of the present invention is defined by the appended claims and includes all modifications within the sense and scope equivalent to the definition of the appended claims.

What is claimed is:

1. A method for manufacturing a light-receiving device, the method comprising the steps of:

forming a stacked semiconductor layer including a non-doped light-receiving layer on a substrate, the light-receiving layer having an n-type conductivity;

forming a selective growth mask made of an insulating film on the stacked semiconductor layer, the selective growth mask having a pattern including a plurality of openings;

selectively growing a selective growth layer doped with a p-type impurity on each portion of the stacked semiconductor layer that is exposed through each of the openings by using the selective growth mask; and forming a plurality of p-n junctions in the light-receiving layer by diffusing the p-type impurity doped in each selective growth layer into the light-receiving layer, wherein each p-n junction is formed during the step of selectively growing a selective growth layer, each of the p-n junctions corresponds to one of the selective growth layers, and at least one p-n junction in the light-receiving layer is formed separately from other p-n junctions in the light-receiving layer.

2. The method according to claim 1, wherein the stacked semiconductor layer includes a non-doped intermediate layer formed on the light-receiving layer, the selective growth mask is formed on the intermediate layer, and each portion of the stacked semiconductor layer on which a selective growth layer is selectively grown is a portion of the intermediate layer that is exposed through the openings by using the selective growth mask.

3. The method according to claim 1, wherein each p-n junction has an end disposed at a surface of the stacked semiconductor layer, and each said end of each p-n junction is covered with the selective growth mask in the step of selectively growing the selective growth layer.

4. The method according to claim 1, wherein, in the step of selectively growing the selective growth layer, the p-type impurity is doped while increasing a concentration of the p-type impurity gradually or in stages from non-doping or slight doping concentration with the elapse of the growth time.

5. The method according to claim 1, wherein each selective growth layer is grown at a growth temperature of 450° C. to 550° C. by metal-organic vapor phase epitaxy using metal-organic compounds for a III group source material and a V group source material.

6. The method according to claim 1, wherein each selective growth layer includes at least one of an InGaAs layer, an InP layer, and a composite layer composed of an InGaAs layer and an InP layer.

7. The method according to claim 1, wherein the insulating film constituting the selective growth mask includes one of a SiN film, a SiON film, and a SiO$_2$ film.

8. The method according to claim 1, wherein the light-receiving layer includes a type-II multi quantum well structure or a single bulk layer.

9. The method according to claim 1, wherein the light-receiving layer includes a type-II multi quantum well structure that is composed of an InGaAs layer and a GaAsSb layer stacked alternately or a GaSb layer and an InAs layer stacked alternately.

* * * * *